United States Patent [19]

Ward

[11] Patent Number: 5,026,775

[45] Date of Patent: Jun. 25, 1991

[54] POLYVINYL BUTYRAL PELLICLE COMPOSITIONS

[76] Inventor: Irl E. Ward, 1526 Leon Dr., Hatfield, Pa. 19440

[21] Appl. No.: 389,280

[22] Filed: Aug. 3, 1989

[51] Int. Cl.$^5$ .................... C08F 8/28; C08G 63/12; B32B 27/36

[52] U.S. Cl. ........................................ 525/61; 428/38; 428/524; 315/315; 315/318

[58] Field of Search ............... 525/61; 428/524, 425.3, 428/437, 38; 315/315, 318

[56] References Cited

U.S. PATENT DOCUMENTS 4,413,091 11/1983 Iwasaki et al. ................. 525/61
4,476,172 10/1984 Ward ................................ 428/447
4,482,591 11/1984 Ward ................................. 428/66

OTHER PUBLICATIONS

Catalog 381, Scientific Polymer Products.

Primary Examiner—Joseph L. Schofer
Assistant Examiner—Tom Weber
Attorney, Agent, or Firm—John Lezdey

[57] ABSTRACT

An improved pellicle for use in projection printing comprises a pellicle in which the transparent film is formed from a specific polyvinyl butyral resin from a casting composition which is a mixture of the specific polyvinyl butyral resin and dimethylformamide.

4 Claims, No Drawings

POLYVINYL BUTYRAL PELLICLE COMPOSITIONS

FIELD OF THE INVENTION

This invention relates to pellicles formed from specific polyvinyl butyral resins for use in projection printing wherein said pellicles can be used in the deep UV region as well as the mid and near UV regions and to castable compositions for preparing films for use in said pellicles. More particularly, the invention relates to polyvinyl butyral pellicles having superior optical properties and lower absorption characteristic then existing polyvinyl butyral pellicles. In addition, the pellicles have improved nitrogen blow strength and Young's Modulus.

BACKGROUND OF THE INVENTION

In the field of projection printing and especially in the semiconductor industry and in the manufacture of integrated circuits the use of pellicles to shield a photomask from airborne particulate matter has gained increasing acceptance and use because of the multitude of benefits derived from their use. The employment of a pellicle for projection printing is described, for example, in U.S. Pat. No. 4,131,363, issued Dec. 26, 1978 to Shea et al and the article of Spivack et al entitled, "Evaluation of Parylene and Other Pellicles as Beam Splitters", *Electro-Optical System Design Corp.*, (1973) pages 362–370, which are herewith incorporated by reference. The use of such pellicles in projecting printing has resulted in a reduction in mask and printing defects, increased mask reticle life, reduced aligner downtime, increased mask quality and increased device and reticle yield. Materials employed in the prior art and suitable for the production of films utilizable as pellicle films include polymer films of polyoxyethylene terephthalate, nitrocellulose and parylene.

Prior art polymer films other than polyvinyl butyral while finding usefulness in projection printing systems as pellicle films have been severely limited in their usefulness. For example, while pellicles of such polymer films are useful in the near UV region (wavelengths 340–436 nm) and some usefulness in the mid UV region (wavelengths 280–340 nm) none has been acceptable for use in the deep UV region (wavelength 200–280 nm). Prior art pellicle films, while providing acceptable properties for use in the near and mid UV regions, have not provided acceptable light transmission properties in the deep UV region and thereby cannot be utilized in the deep UV region.

Additionally, although the prior art pellicle films have found usefulness in the near and mid UV regions, their performance has not been entirely satisfactory. Among the many factors detracting from their usefulness in these regions is the fact that their light transmission properties are not substantially 100% at the projection wavelengths but rather are generally 99% or less. Also, film tensile strength of the pellicle films has generally been in the range of 3000–5000 psi and the need for a film of increased tensile strength to increase the pellicle film life is desirable. Additionally, the percent of undesirable light scattering in said prior art pellicle films has generally been in the range of 0.3% at 365 nm. A film of decreased light scattering is highly desirable. Also with the prior art pellicle films, the percent etaloning, namely the difference between peak and minimum transmission, has only been as low as about 18% and it is of great advantage to reduce such etaloning as much as possible to increase the average light transmission properties of the pellicles.

It is highly desirable that a pellicle film be available which is useful in the deep UV region and which is as good or better in performance characteristics and/or physical properties as has been the case with pellicle films used in the mid or near UV regions. Moreover, it is also highly desirable that such pellicle film be useful in all three UV regions and that the performance characteristics and/or physical properties of such pellicle film in the mid and near UV regions be improved in whole or in part compared to the performance characteristics and/or physical properties of the materials heretofore employed in the prior art for pellicle films in the mid or near UV regions.

It is known that not all polyvinyl butyral resin films provide the necessary optical properties to function as a pellicle for projection printing. It is further desirable that polyvinyl butyral pellicles be free of any impurities which may interfere with its transmission of light. A common problem with polyvinyl butyral pellicles resides in the presence of a carbonyl group which is believed to be derived from the vinyl acetate found in the precursor materials. In addition, the solvent systems which have been previously used with the polyvinyl butyral resins to form the pellicles have not resulted in the most efficient solvent system for the minimization of impurities. Surprisingly, applicant has discovered that dimethylformamide which contains a carbonyl group is an effective solvent.

Pellicles may be prepared by any of the conventional methods of casting, float casting or rotation spinning. Generally, the polymer/solvent mixtures constitute from about 5% to about 30% by weight of polymer. Leveling agents such as silicone fluids may be added.

Castable solutions of the polyvinyl butyral of the invention may be made depending upon the method used to make the pellicle. Generally a casting solution of 10–15% by weight of solids will result in film formed by rotation spinning between 2000 and 3000 rpm of about 1.2–2.0 microns.

U.S. Pat. No. 4,482,591 to Irl E. Ward relates to polyvinyl butyral pellicles which are formed from specific polyvinyl butyral resins possessing specified hydroxy, acetate and butyral content, namely, less than 13%, less than 2% and more than 88% respectively. This patent specifically teaches the utilization of a polyvinyl butyral derived from a solvent system comprising 2-ethoxyethanol and tetrahydrofurfuryl alcohol or methyl ethyl ketone.

SUMMARY OF THE INVENTION

It has been discovered that specific polyvinyl butyral polymer film which were previously found not to be suitable for use as a pellicle film when placed in a specific solvent system provides an improvement over prior polyvinyl butyral pellicles such as disclosed in said U.S. Pat. No. 4,482,591. These pellicles can be used in projection printing in the near, mid and deep UV regions and have improved high light transmission properties as well as performance characteristics and/or physical properties as good as or better than prior polyvinyl butyral pellicle films heretofore available. Additionally, a pellicle film cast from castable solution of a specific polyvinyl butyral resin in dimethylformamide or diethylene glycol dimethyl ether (diglyme) results in a film with further improved light transmission properties in the deep UV region.

DESCRIPTION OF THE PREFERRED EMBODIMENTS

In accordance with the present invention a pellicle is formed having improved performance characteristics with a solvent system of dimethylformamide or diglyme and a polyvinyl butyral resin of the general formula:

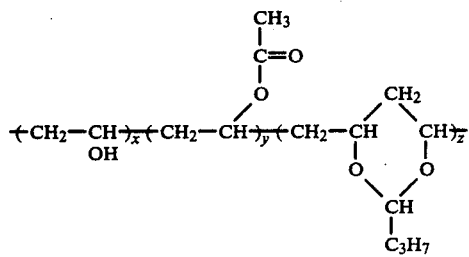

wherein x is $\geq 0.18$; y is 0.0–2.5% and z is $\leq 0.80$. In said polyvinyl butyral the hydroxyl content of the polymer expressed as percent polyvinyl alcohol is equal to or greater than 18%, generally from about 18 to 22%, the acetate content expressed as percent polyvinyl butyral is at least about 80%. That is, while x, y and z are as defined above they preferably are defined as x is 0.18 to 0.22, y is 0.00 to 2.5% and z is equal to or less than 0.80. Polymers wherein x is about 0.19, y is about 0.3 to 1.0% and z is about 0.80 have been found to be suitable. A suitable polyvinyl butyral meeting said criteria is polyvinyl butyral resin of Scientific Polymer Products, Inc., Ontario, N.Y., Technical Bulletin dated August 1987 identified as catalog no. 381. The preferred polyvinyl butyrals of the invention have a specific gravity of at least 1.100 and a weight average molecular weight between about 50,000 and 150,000.

Advantageously, the polyvinyl butyral resins utilized in the present invention are substantially free of any impurities containing carbonyl groups. To ensure that the polyvinyl butyral resins which are utilized are free of the impurities it is advisable to purify the resins by washing with an appropriate non-solvent.

It is further critical in the invention to utilize dimethylformamide or diglyme to form the casting solution. The dimethylformamide or diglyme are believed to provide a pellicle having improved spectral characteristics, thickness uniformity and surface homogeneity when utilizing BUTVAR B-90 and B-98, polyvinyl butyral resins of Monsanto Company of St. Louis, Mo., as described in their Technical Bulletin No. 6070D, which prior to the present invention were considered as being incapable of producing a suitable pellicle. The preferred solvent is dimethylformamide.

The following examples illustrate embodiments of this invention. It is to be understood, however, that these are for illustrative purposes only and do not purport to be wholly definitive as to condition and scope for preferred practice of the invention. All amounts herein shown are in percent by weight except as otherwise stated.

EXAMPLE 1

A. A casting solution was prepared by dissolving 12.25 g of purified polyvinyl butyral resin in 100 ml of dimethylformamide.

B. Preparation of pellicle

Following the procedure described in U.S. Pat. No. 4,449,231, the casting solution of part A is poured onto a flat polished substrate such as a 5" clean-dry silicon wafer, such that the substrate is flooded with about 10 to 40 ml of solution before spinning begins. The substrate is then spun on a Headway EC101 Series spinner at 2000–3000 rpm for 1 minute to form a uniform film. The substrate is permitted to stand at room temperature overnight to evaporate the solvent. The polymer had a y=0.01.

The cured film was removed.

C. Similar results may be obtained with diglyme. Five runs were made on the spinner at a rotational speed of 2800 rpm which resulted in film thickness (microns) as follows:
1. 1.800
2. 1.790
3. 1.806
4. 1.804
5. 1.796

EXAMPLE 2

Following the procedure of Example 1 films were prepared with 10.75% of purified polyvinyl butyral resin in (A) cellosolve, (B) 60% cellosolve-40% dimethylformamide (DMF) and (C) 11.25% of purified polyvinyl butyral resin in 100% dimethylformamide.

All of the polyvinyl butyral resin utilized was from Scientific Polymer Products, Inc., Catalog No. 381. The light transmission test on a UV/VIS P.E. Lambda 6 Spectrometer was as follows:

| Sample | | λ | | | | | |
|---|---|---|---|---|---|---|---|
| | | 300 | 270 | 250 | 240 | 230 | 210 |
| (A) 100% cellosolve (1.96 microns) | %/t | 99.0 | 98.1 | 97.5 | — | 96.1 | 94.0 |
| (B) 60/40 cell./DMF | %/t | 99.3 | 98.5 | 98.3 | 97.4 | 96.4 | 93.9 |
| (C)100% DMF (1.36 microns) | %/t | 99.4 | 99.0 | 98.5 | 98.2 | 97.3 | 95.2 |

EXAMPLE 3

A comparative study was run between (A) the pellicle of Example 1 and (B) a pellicle produced from BUVAR B-79 according to Example 2 of U.S. Pat. No. 4,482,591 utilizing a Bausch & Lomb Spectronic 2000. Spectral grade cellosolve from Aldrich was used as the solvent and SiO$_2$ 1 cm cuvettes were used to hold a 5% w/w solution of each polymer. A baseline was established about 265 nm. The following results were obtained.

| SAMPLE | Abs. (λ = 265) | λ-cut-off |
|---|---|---|
| A | 0.18 au | None (peak-221) (Abs.-0.58) |
| B | ~0.3 au | ~236 (λ at which Abs. = 1.0) | au = Absorption units

What is claimed is:

1. A pellicle film produced from a solution wherein dimethylformamide in the solvent, for use in projection printing comprising a film formed from a polyvinyl butyral of the formula

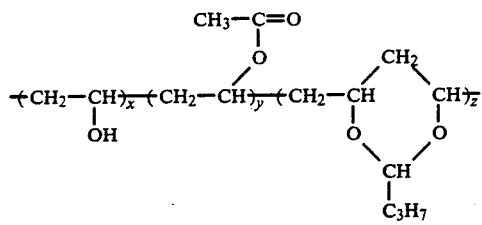

wherein x is greater than or equal to 0.18, y is 0.0 to 0.025 and z is less than or equal to 0.80, said polyvinyl butyral having an average molecular weight of between about 50,000 and 150,000.

2. The pellicle film of claim 1 wherein x is from about 0.18 to about 0.22, y is from about 0.01 to about 2.5% and z is about 0.80.

3. The pellicle film of claim 3 wherein x is about 0.19, and y is from about 0.3 to 1.0% and z is about 0.80.

4. The pellicle film of claim 1 wherein said polyvinyl butyral resin has a specific gravity of at least 1.100.

* * * * *